United States Patent
Pulkin et al.

(10) Patent No.: US 6,734,705 B2
(45) Date of Patent: May 11, 2004

(54) TECHNIQUE FOR IMPROVING PROPAGATION DELAY OF LOW VOLTAGE TO HIGH VOLTAGE LEVEL SHIFTERS

(75) Inventors: Mark Pulkin, Rowlett, TX (US); David D. Briggs, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/217,249

(22) Filed: Aug. 12, 2002

(65) Prior Publication Data

US 2003/0042536 A1 Mar. 6, 2003

Related U.S. Application Data

(60) Provisional application No. 60/315,848, filed on Aug. 29, 2001.

(51) Int. Cl.[7] ............................................. H03K 19/175
(52) U.S. Cl. .............................. 326/68; 326/62; 326/83; 327/333; 327/371
(58) Field of Search ........................... 326/62, 68, 80, 326/81, 83; 327/333

(56) References Cited

U.S. PATENT DOCUMENTS 5,896,043 A * 4/1999 Kumagai ..................... 326/68
6,373,315 B2 * 4/2002 Tsuji et al. .................. 327/333

* cited by examiner

Primary Examiner—Vibol Tan
(74) Attorney, Agent, or Firm—Alan K. Stewart; W. James Brady, III; Frederick J. Telecky, Jr.

(57) ABSTRACT

The low voltage to high voltage level shifter has falling-edge 1-shot circuits 34 and 36 coupled to the outputs OUT and OUT_B of cross gate-connected transistors 24 and 26 and pull-down transistors 20 and 22. The falling-edge 1-shot circuits 34 and 36 output a narrow pulse when the outputs OUT and OUT_B transition from a high state to a low state. These pulses are used to set and reset a flip-flop 38. The flip flop 38 provides an output that is only dependent on the very fast fall times of the outputs OUT and OUT_B. This allows the level shifter to be designed for optimal transitional performance without the sacrifice of a potentially long propagation delay on the output nodes.

18 Claims, 2 Drawing Sheets

TECHNIQUE FOR IMPROVING PROPAGATION DELAY OF LOW VOLTAGE TO HIGH VOLTAGE LEVEL SHIFTERS

This application claims priority under 35 USC § 119 (e)(1) of provisional application No. 60/315,848 filed Aug. 29, 2001.

FIELD OF THE INVENTION

This invention generally relates to electronic systems and in particular it relates to low voltage to high voltage level shifters.

BACKGROUND OF THE INVENTION

The design of a low voltage to high voltage level shifter usually involves striking a balance between the strength of the pull-down NMOS transistors 20 and 22 and the cross gate-connected PMOS transistors 24 and 26 as shown in the prior art circuit of FIG. 1. The circuit of FIG. 1 also includes inverters 28 and 30; input IN; low voltage source VL; high voltage source VH; outputs OUT and OUT_B; and ground node gnd. If the gains of the NMOS transistors 20 and 22, and PMOS transistors 24 and 26 are similar, there is the risk of the level shifter not switching output states. If the NMOS transistors 20 and 22 are much stronger than the PMOS transistors 24 and 26, then the propagation delay of the rising edge of the outputs OUT and OUT_B can be much longer than in the falling edge, due to the weak PMOS transistors. This can be a problem in certain applications, when both rising and falling propagation delays are significant factors.

SUMMARY OF THE INVENTION

A low voltage to high voltage level shifter has falling-edge 1-shot circuits coupled to the outputs of a basic level shifter with cross gate-connected transistors and two pull-down transistors. The falling-edge 1-shot circuits output a narrow pulse when these outputs transition from a high state to a low state. These pulses are used to set and reset a flip-flop. The flip flop provides an output that is only dependent on the very fast fall times of the outputs of the basic level shifter. This allows the level shifter to be designed for optimal transitional performance without the sacrifice of a potentially long propagation delay on the output nodes.

DESCRIPTION OF PREFERRED EMBODIMENTS

Figure 1:
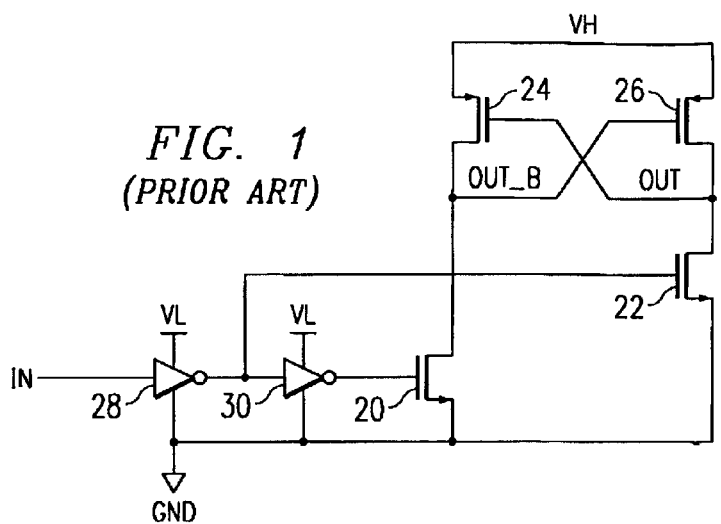
FIG. 1 is a schematic circuit diagram of a prior art low voltage to high voltage level shifter.
Figure 2:
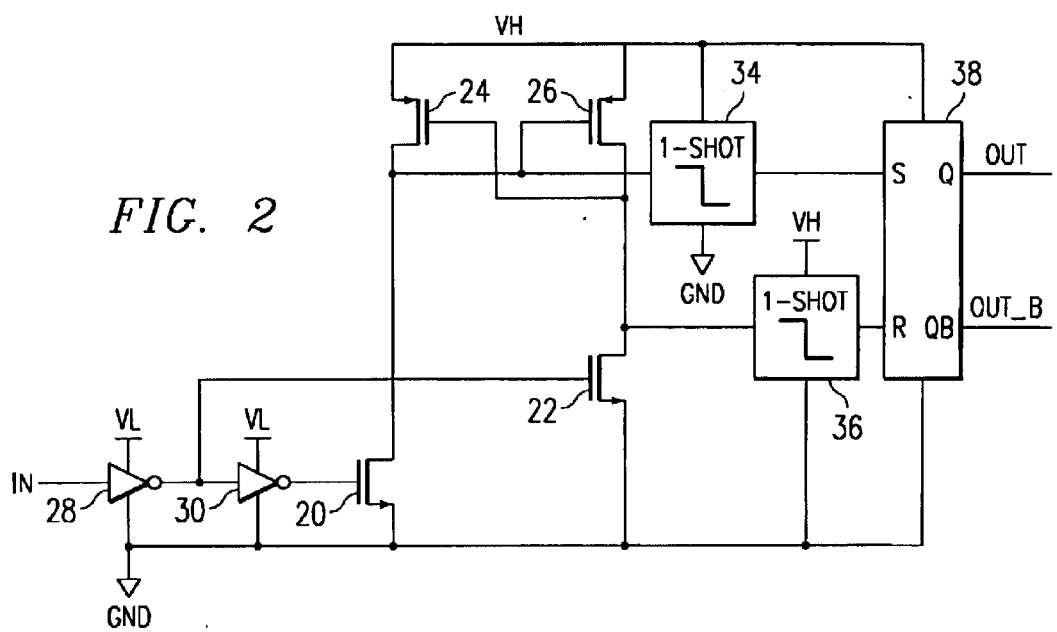
FIG. 2 is a schematic circuit diagram of a preferred embodiment low voltage to high voltage level shifter.

A preferred embodiment low voltage to high voltage level shifter is shown in FIG. 2. The preferred embodiment circuit of FIG. 2 combines the prior art circuit of FIG. 1 with additional circuitry, involving two falling-edge 1-shots 34 and 36, and an SR flip-flop 38. The preferred embodiment level shifter is designed so that the cross gate-connected PMOS transistors 24 and 26 are much weaker than the pull-down NMOS transistors 20 and 22. This insures that the output nodes OUT and OUT_B will transition correctly. It also means that the output nodes will have very fast fall times, but much slower rise times.

Figure 3:
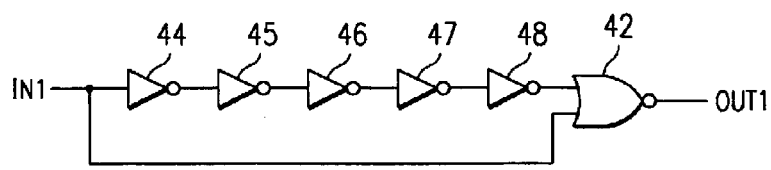
FIG. 3 is a schematic diagram of a falling edge 1-shot device.

The falling-edge 1-shots 34 and 36 are each comprised of the circuit shown in FIG. 3. The circuit of FIG. 3 includes NOR gate 42, inverters 44–48, input IN1, and output OUT1. The falling-edge 1-shot circuit of FIG. 3 is a digital circuit that outputs a narrow pulse when the input IN1 transitions from a high state to a low state. These pulses are used to set and reset the SR flip-flop 38 of FIG. 2. Thus, the output of the circuit is only dependent on the very fast fall times of the level shifter.

Figure 4:
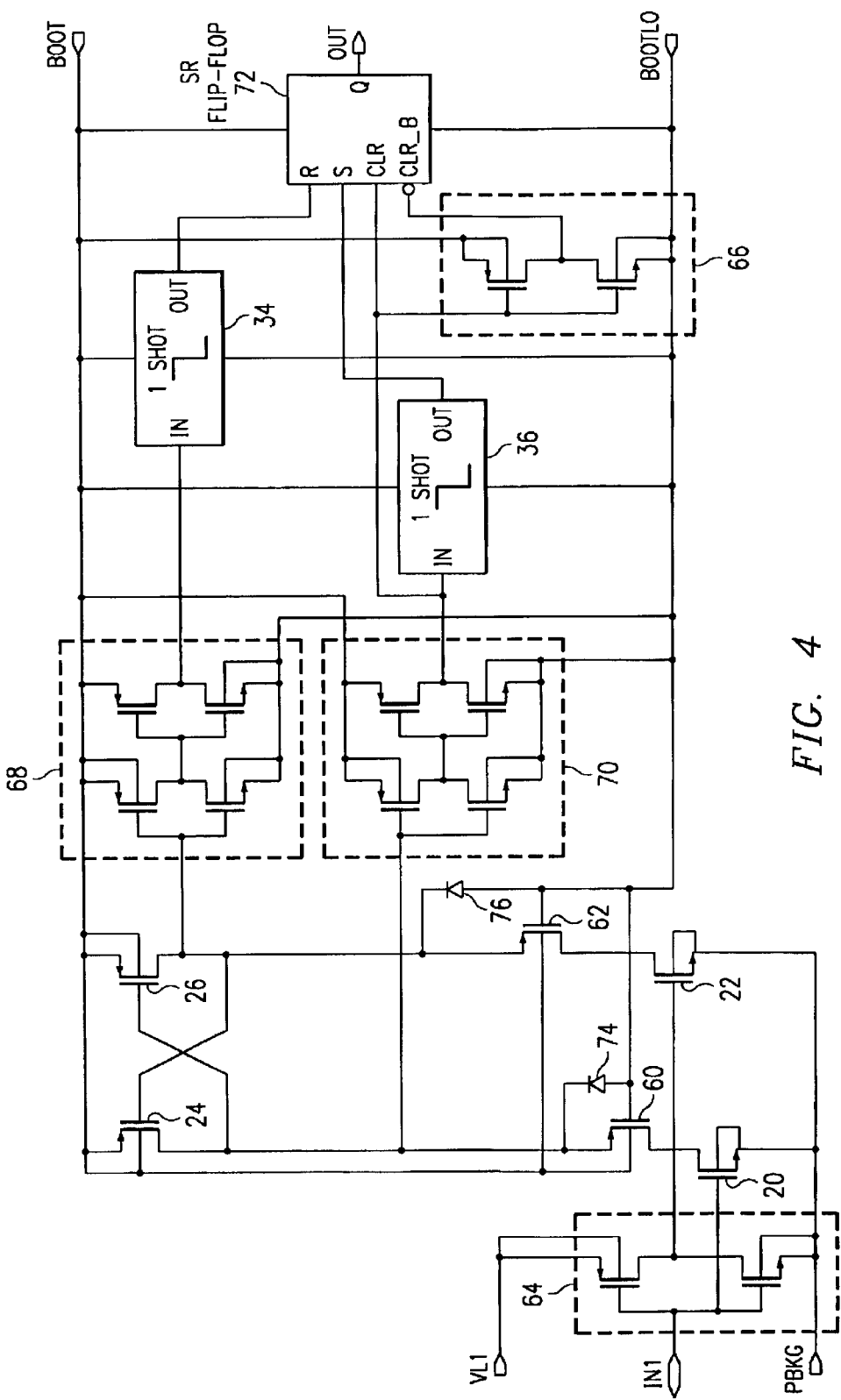
FIG. 4 is a schematic circuit diagram of an alternative embodiment low voltage to high voltage level shifter.

FIG. 4 shows an alternative embodiment of the low voltage to high voltage level shifter of FIG. 2 with additional circuitry for a "bootstrapping" technique. The circuit of FIG. 4 includes transistors 20, 22, 24, 26, 60, and 62; inverters 64 and 66; falling edge 1-shots 34 and 36; buffers 68 and 70; SR flip flop 72; diodes 74 and 76; input IN1; low voltage source VL1; common node PBKG; high voltage source BOOT; common node BOOTLO; and output node out. The primary difference from the circuit of FIG. 2 is the bootstrapping transistors 60 and 62. The inputs clr and clr_b of flip flop 72 allow for start-up initialization of flip flop 72.

The advantages of the preferred embodiment solution are: 1) it allows the level shifter to be designed for optimal transitional performance (by making the NMOS's much stronger than the PMOS's) without the sacrifice of a potentially long propagation delay on the output nodes, and 2) it needs only one level shifter, which usually requires high-voltage devices that can take up a lot of area.

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   first and second pull down transistors;
   a first cross gate transistor coupled to the first pull down transistor;
   a second cross gate transistor coupled to the second pull down transistor, the first and second cross gate transistors are cross gate coupled;
   a first falling edge 1-shot circuit having an input coupled to the first cross gate transistor;
   a second falling edge 1-shot circuit having an input coupled to the second cross gate transistor; and
   a flip flop circuit having a first input coupled to an output of the first falling edge 1-shot circuit and a second input coupled to an output of the second falling edge 1-shot circuit.

2. The circuit of claim 1 further comprising:
   a first inverter having an output coupled to a control node of the second pull down transistor; and
   a second inverter having an input coupled to the output of the first inverter and an output coupled to a control node of the first pull down transistor.

3. The circuit of claim 2 wherein the first and second inverters are coupled to a first voltage source and the first and second cross gate transistors are coupled to a second voltage source.

4. The circuit of claim 3 wherein the second voltage source is a higher voltage than the first voltage source.

5. The circuit of claim 1 wherein the first 1-shot circuit provides a narrow pulse when the input of the first 1-shot circuit transitions from a high state to a low state.

6. The circuit of claim 1 wherein the second 1-shot circuit provides a narrow pulse when the input of the second 1-shot circuit transitions from a high state to a low state.

7. The circuit of claim 1 where the first and second 1-shot circuits each comprise:
    a NOR gate having first and second input nodes; and
    an inverter coupled between the first and second input nodes.

8. The circuit of claim 1 where the first and second 1-shot circuits each comprise:
    a NOR gate having first and second input nodes; and
    an odd number of inverters coupled between the first and second input nodes.

9. The circuit of claim 1 where the first and second 1-shot circuits each comprise:
    a NOR gate having first and second input nodes; and
    five inverters coupled between the first and second input nodes.

10. The circuit of claim 1 further comprising:
    a first bootstrapping transistor coupled between the first pull down transistor and the first cross gate transistor; and
    a second bootstrapping transistor coupled between the second pull down transistor and the second cross gate transistor.

11. The circuit of claim 10 wherein a bootstrapping input node is coupled to control nodes of the first and second bootstrapping transistors.

12. The circuit of claim 1 wherein the flip flop circuit is an SR flip flop.

13. The circuit of claim 1 wherein the first input of the flip flop circuit is a SET input and the second input of the flip flop circuit is a RESET input.

14. A voltage level shifter circuit comprising:
    a first transistor;
    a second transistor;
    a third transistor coupled in series with the first transistor;
    a fourth transistor coupled in series with the second transistor, and cross gate-coupled to the third transistor;
    a first logic circuit having an input coupled to the third transistor, the first logic circuit provides a first output pulse when the input of the first logic circuit transitions from a high state to a low state; and
    a second logic circuit having an input coupled to the fourth transistor, the second logic circuit provides a second output pulse when the input of the second logic circuit transitions from a high state to a low state.

15. The circuit of claim 14 further comprising an inverter coupled between a control node of the first transistor and a control node of the second transistor.

16. The circuit of claim 14 further comprising a flip flop having a first input for receiving the first output pulse and a second input for receiving the second output pulse.

17. The circuit of claim 14 further comprising an SR flip flop having a SET input for receiving the first output pulse and a RESET input for receiving the second output pulse.

18. A method for shifting an input signal from a low voltage level to a high voltage level comprising:
    providing a first transistor coupled to a first node;
    providing a second transistor coupled in series with the first transistor and coupled to the first node;
    providing a third transistor coupled to a second node;
    providing a fourth transistor coupled in series with the third transistor and coupled to the second node;
    cross gate-coupling the second and fourth transistors;
    providing a first voltage pulse when the first node transitions from a high state to a low state;
    providing a second voltage pulse when the second node transitions from a high state to a low state;
    coupling the first voltage pulse to a SET input of a flip flop; and
    coupling the second voltage pulse to a RESET input of the flip flop.

* * * * *